United States Patent [19]
Dietz et al.

[11] Patent Number: 5,517,053
[45] Date of Patent: May 14, 1996

[54] SELF STABILIZING HEATER CONTROLLED OSCILLATING TRANSISTOR

[75] Inventors: Gregory R. Dietz, Schaumburg; Sanjay Moghe, Hoffman Estates; Richard R. Becker, Elmhurst, all of Ill.

[73] Assignee: Northrop Grumman Corporation, Los Angeles, Calif.

[21] Appl. No.: 370,082

[22] Filed: Jan. 9, 1995

[51] Int. Cl.[6] .................................................. H01L 31/058
[52] U.S. Cl. ........................... 257/467; 257/469; 331/176
[58] Field of Search ..................................... 257/467, 468, 257/469, 604; 331/69, 70, 78, 176

[56] References Cited

U.S. PATENT DOCUMENTS

| | | | |
|---|---|---|---|
| 3,703,651 | 11/1972 | Blowers | 257/467 |
| 3,986,196 | 10/1976 | Decker et al. | 357/22 |
| 4,599,581 | 7/1986 | Tsironis | 331/66 |
| 4,616,194 | 10/1986 | Renoult et al. | 331/116 R |
| 4,728,907 | 3/1988 | Cohen | 331/107 R |
| 4,760,434 | 7/1988 | Tsuzuki et al. | 257/470 |
| 4,808,009 | 2/1989 | Sittler et al. | 374/178 |
| 4,956,697 | 9/1990 | Kobiki et al. | 357/81 |
| 5,045,503 | 9/1991 | Kobiki et al. | 437/228 |
| 5,148,124 | 9/1992 | Goff | 331/78 |

FOREIGN PATENT DOCUMENTS 4185106  11/1990  Japan.

*Primary Examiner*—Rolf Hille
*Assistant Examiner*—Minhloan Tran
*Attorney, Agent, or Firm*—Terry J. Anderson; Karl J. Hoch, Jr.

[57] ABSTRACT

A frequency stable oscillating device includes an oscillating transistor. A heating element is disposed in close proximity to the oscillating transistor. A temperature sensor is mounted in close proximity to the oscillating transistor. A temperature control device supplies a variable signal which is dependant upon a local temperature of the oscillating transistor, wherein the variable signal controls the operation of the heating element. The heating element may alternately consist of one or more resistive patches, or one or more heating transistors which are biased to provide sufficient heating. The oscillating device may be formed from either IC or MMIC technologies, and may be formed from either silicon or GaAs.

12 Claims, 5 Drawing Sheets

SELF STABILIZING HEATER CONTROLLED OSCILLATING TRANSISTOR

FIELD OF THE INVENTION

The present invention relates to a frequency stabilizing system for an oscillating transistor, and more particularly to a system in which a local temperature sensor, which is placed in close proximity to the oscillating transistor, controls an integrally mounted heating element to maintain a temperature of the oscillating transistor, thereby regulating the frequency characteristics of the oscillating transistor.

BACKGROUND OF THE INVENTION

Electronic circuits can generally be categorized as discrete circuits, integrated circuits (IC), or monolithic microwave integrated circuits (MMIC). IC technology includes a chip which is formed from a single doped crystal. Silicon is the typical substrate used in high frequency IC applications and is sometimes used in the higher frequency microwave frequencies. Gallium Arsenide substrates are generally better suited to microwave frequencies and are thus often used for fabricating MMICs.

The recent advances made in MMIC (as well as other integrated circuit) technology are well known, and have been applied to such demanding and varied fields as communications and avionics. One of the basic components of MMIC and IC technology is the oscillating transistor, which may be defined as a transistor device that is biased to convert a DC input into an AC output, and which is especially useful in frequency generation applications, etc.

One difficulty with oscillating transistors, however, is that local temperature variations modify the frequency of the signal being generated. It is typical to maintain the oscillating transistor within a narrow temperature range if the desired frequency is to be maintained. Temperature variations may be caused by heat developed within the electronic circuit itself, or by changes in ambient temperature such as may occur from a change in the altitude of an aircraft. Accurate frequency stabilization based upon maintaining a constant local temperature of the oscillating transistor is a preferable technique for many IC and MMIC applications. Although maintaining the temperature of the oscillating transistor is preferred in many of the disclosed embodiments of the present invention, this is not required in all cases.

There are several techniques which are known to compensate for a variable temperature of an oscillating transistor. Some techniques change the temperature at which the oscillating transistor is operating at to maintain a constant output frequency. The input of the oscillating transistor can be modified to compensate for a variation in temperature. Modifying the output of the oscillating transistor typically requires a complex feedback system which must function under substantially real time conditions.

Certain prior art oscillating transistors involve applying heating elements to the transistors to establish a predetermined narrow range of operating temperatures. However, these oscillating transistors either have no temperature sensor, and/or the heating element is not interspersed with the oscillating transistor.

A heat controlled oscillating FET is disclosed in Japanese Patent 04-185106 to Fumiaki which was published on Jul. 2, 1992. In the Japanese patent, the heating elements are not interspersed with the oscillating transistor. When the oscillating FET of Fumiaki is configured to provide significant power, the components of the oscillating transistor typically becomes much larger. When the dimensions of the oscillating FET are enlarged, it becomes difficult to evenly heat the oscillating FET so that the operation of the FET can be reliably predicted. Even heating elements located on the same chip as the oscillating transistor may not control the temperature of an oscillating FET as closely as desired if the size of the oscillating FET becomes very large. Consequently, the design of the prior art oscillating transistors with heaters is often insufficient to maintain the oscillating FETs within the desired temperature range. It is also difficult to precisely sense the temperature of a relatively large oscillating transistor. The reliability and predictability of such circuits typically decrease with increasing size. Additionally, it is difficult to place the heating unit in close proximity to the oscillating FET due to the associated wiring (busses) of the components on the chip itself.

From the above, it should be evident that a device which reliably maintains the local temperature of an oscillating transistor within a narrow temperature range is desired and represents a significant improvement over the prior art.

SUMMARY OF THE INVENTION

The present invention relates to a frequency stable oscillating device including an oscillating transistor. A heating element is interspersed with said oscillating transistor. A temperature sensor is capable of sensing a temperature of the oscillating transistor. A temperature control device supplies a variable signal to said heating element which is dependent upon a local temperature of the oscillating transistor.

DETAILED DESCRIPTION OF THE INVENTION

Figure 1:
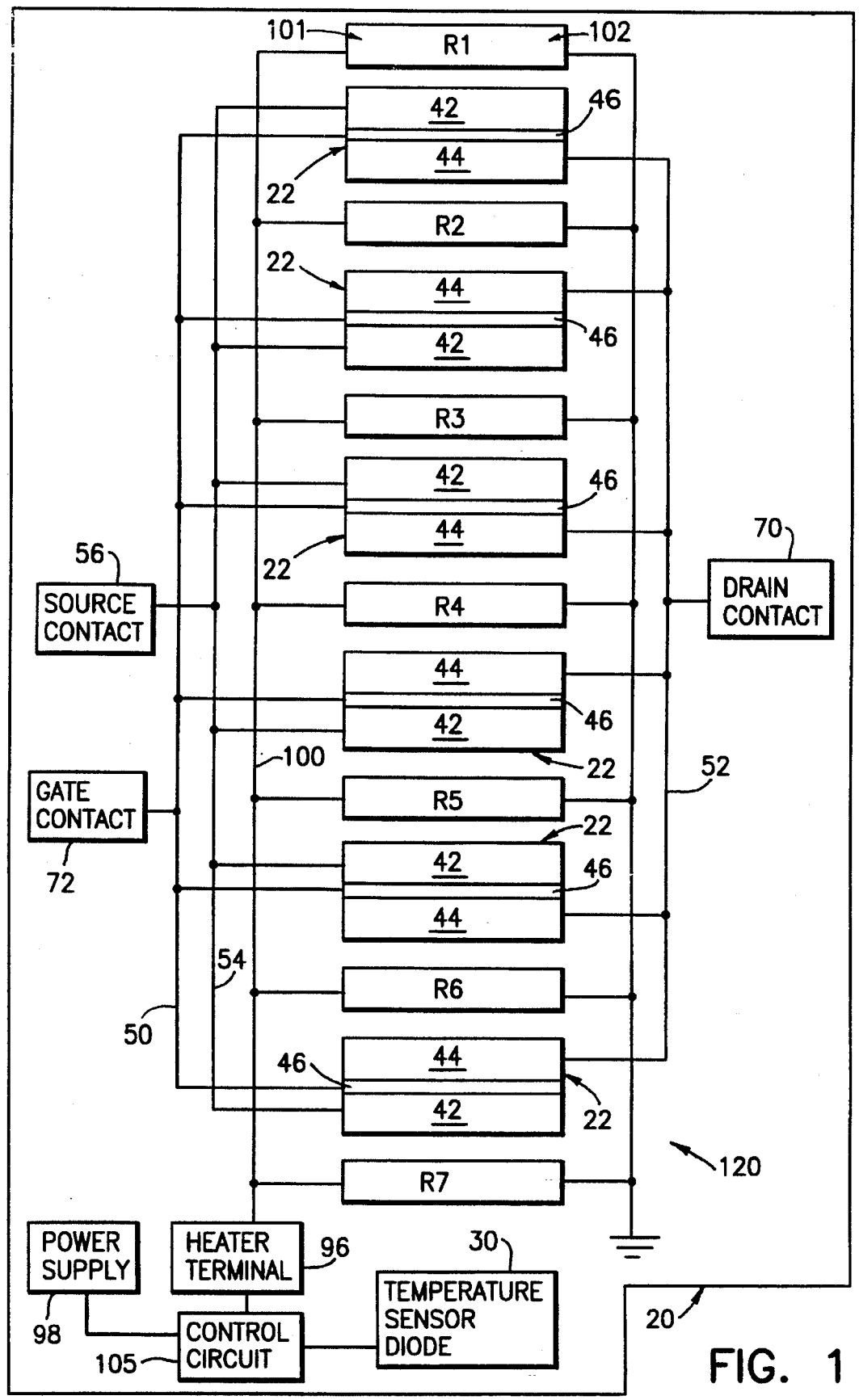
FIG. 1 illustrates a plan view of the embodiment of electronic circuit of the present invention which utilizes frequency stabilized oscillating transistors with closely positioned heating patches (R1 to R7)

In this disclosure, similar reference characters may be applied to elements which perform similar functions in the different embodiments. Any reference to temperatures, currents, voltages, etc. used in this specification is intended to be illustrative, and not limiting in scope. In this disclosure, the term ambient temperature within a chip is defined as the average temperature at which the chip normally operates at, when all normal electric currents are applied to the chip. The normal operating temperature does not include any heat supplied by any heating element.

FIG. 1 illustrates one embodiment of an electronic circuit 20 of the present invention (a portion of which functions as a frequency stable oscillating device) containing a plurality of frequency stabilized MMIC oscillating transistors 22; a plurality of heating elements R1 to R7; and a temperature sensor 30. In the preferred embodiment the temperature sensor 30 is formed from a single diode which applies a variable voltage to a control circuit 105. The voltage supplied by the temperature sensor diode varies based upon its temperature, which is largely dependant upon the temperature of the MMIC oscillating transistor 22 which it is mounted close to. Any suitable type of heat sensor is within the scope of the present invention. A heater terminal portion 96 and a power supply 98 is also included in the FIG. 1 embodiment. The control circuit 105 controls the current applied to, or the voltage applied across, the heating elements R1 to R7 as described below.

In this disclosure, the reference character 22 will refer to both a single MMIC oscillating transistor, or a plurality thereof. Even though many elements in the present disclosure are described and illustrated as MMIC devices, this is intended to be illustrative in nature and not limiting in scope. It is envisioned that ICs could be used in place of MMIC devices. However, since the thermal properties of silicon ICs and GaAs MMICs differ, the designer would have to take into account the thermal characteristics of the devices in designing a suitable, nearly optimal, circuit.

Each MMIC oscillating transistor 22, as illustrated in FIG. 1, contains a source 42, a drain 44, and a gate 46. The MMIC oscillating transistors 22 are illustrated as FETs (Field Effect Transistors), but alternately may be BJTs (Bi-Polar Junction Transistors), or any other suitable type of transistor. For the purpose of this disclosure, however, the FET terminology is used when referring to different portions of the transistor. The MMIC oscillating transistors 22 is any conventional transistor which is properly biased. The frequency and the amplitude of the oscillations vary depending upon the temperature of the MMIC oscillating transistors 22.

In this disclosure, the term "manifold" is defined as an electrical bus which is connected to the referenced component of the transistor. For example, the term "gate manifold" is an electrical connection which is applied to the gate. There is a gate manifold 50 which is connected to the gate portion 46 of each MMIC oscillating transistor 22. There is a drain manifold 52 which is connected to the drain portion 44 of each oscillating transistor 22. There is a source manifold 54 which is connected with the source portion 42 of each oscillating transistor 22. A drain contact 70 forms a contact with the drain manifold 52; a gate contact 72 forms a contact with the gate manifold 50; and there is a source contact 56 which forms a contact with said source manifold 54. Other devices are in contact with the drain contact 70, the gate contact 72, and the source contact 56.

Preferably, at least one heating element of the FIG. 1 embodiment (which takes the form of resistive patches R1–R7) is situated in close proximity to each oscillating transistor 22. The resistive patches R1–R7 are preferably located between adjacent pairs of MMIC oscillating transistors 22. Each resistive patch R1–R7 is sized to be capable of providing sufficient thermal energy to all portions of the associated oscillating transistor 22 to raise the temperature of that oscillating transistor from the minimum ambient temperature which the transistor is likely to experience to a desired operating temperature that is required for stable oscillation. The resistive patch is sized to be relatively small (the length should be no bigger than 100 microns) to provide a frequency response at up to 18 GHZ. Since electronic circuits 20 typically come in different sizes and configurations (with different numbers and sizes of frequency stabilized MMIC oscillating transistors 22 for each electronic circuit 20), the size of each resistive patch R1–R7 is preferably empirically determined for each circuit. The resistive patches may be formed from any suitable resistive material, and preferably is applied by a photolithographic process. Nickel chromium has been found to produce especially effective resistive patches. Additionally, the resistive patches may be formed from forward biased diodes.

In order to provide control of the current supplied to the resistive patches R1–R7, there is a heater control circuit 105 which controls the current applied from a power supply 98 to a heater terminal 96 and a resistor manifold 100. The resistor manifold 100 is connected to a first end 101 of each resistive element R1–R7. A second end 102 of each resistive element R1–R7, which is remote from said first end 101, is electrically grounded. The heating elements R1 to R7 are positioned closely to the MMIC oscillating transistors 22 to form an integral MMIC oscillating transistor-heating section 120.

The heater terminal 96 provides a contact for a current or voltage may be applied to each of the resistive elements R1–R7. Voltage from the control circuit 105 is applied to the heater terminal 96. The control circuit 105 receives input signals from the temperature sensor 30 (which may be formed as a single diode, even though more complex configurations may be provided). It is desirable to locate the temperature sensor 30 in close proximity to the MMIC oscillating transistors 22 to provide a reliable indication of temperature of the MMIC oscillating transistor 22. The operation of the control circuit 105 is generally well known in the electronic controller art. The sizing of the components of the control circuit 105 is a function of certain elements of the circuit (for example the dimensions of the resistive patches), and as such will not be further detailed here.

The heater terminal 96 and the heater manifold 100 is formed from a high electrical conductivity material to limit heat generation and energy consumption of other on-chip locations than the resistive patches R1–R7. The temperature (T) of the resistive patches R1–R7 is directly related to a product of the DC operating bias voltage Vh and the current Ih, according to the equation:

$$T = K \times (Vh \times Ih) + T_{sinc}.$$

where K is the thermal resistance of the patches and $T_{sinc}$ is the temperature of primary heat sink at the backside of the chip.

Assuming that all of the current is being converted into heat, the maximum power which must be supplied to the heating element (assuming a minimum ambient temperature of −50 degrees Centigrade, and the circuit is to be maintained at 100 degrees Centigrade) is determined to be:

$$\textit{Maximum Heater Power} = (Tmax - Tmin)/K$$

where, K is a thermal constant which, for this example, is assumed to equal 50 degrees/watt. K relates to the power necessary to increase the temperature of the resistive patches (degrees/watt); and is dependent on the property of the material used in the resistive patches (heat insulation factor.)

=(100 degrees − (−50 degrees))/50 degrees/watt
=3.0 Watts

The resistive patches R1–R7 must be sized to be able to convert at least as much electrical energy into heat as the maximum required heater power.

Figure 4:
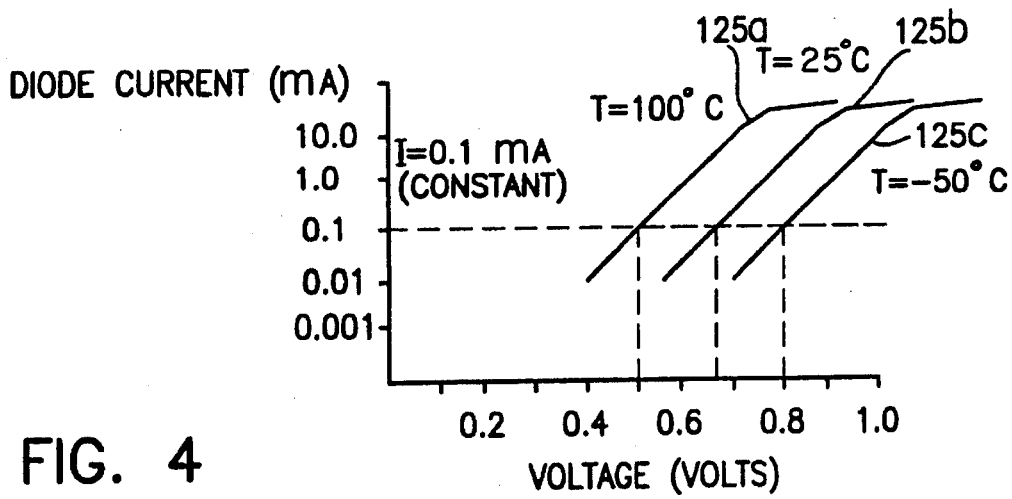
FIG. 4 illustrates a typical voltage vs. current plot, for three temperatures, for a single diode of the temperature controller.

The diode incorporated in the temperature sensor 30 is affected by the heater as the chip temperature rises. The heat generated by the resistive patches (or heating device) is absorbed by its surroundings (i.e. the oscillating transistor active device) and after a period of time, depending upon the ambient temperature and the circuit thermal characteristics, the temperature rises raising the temperature of the diode. The diode functions as illustrated in FIG. 4 and provides the corresponding change in the voltage applied to the control circuit 105. The varied voltage applied to the control circuit 105 results in regulated heat output from the heater, which provides a stable temperature for the oscillating transistors.

The embodiment of the present invention using resistive patches, as illustrated in FIG. 1, has the advantage of being able to dissipate relatively high power densities. The resistive patches therefore are suitable for very low ambient temperature applications. The wiring of the resistive patches R1–R7 permits the effectiveness of the heating elements to be modified (i.e. if the resistors are wired in series). Not as much current but more voltage is required for the same output than if the resistors are wired in parallel. The sizing of the resistive patches may be altered varying the power requirement of the heater depending upon the environment to which the MMIC oscillating transistor 22 is likely to encounter.

Figure 2:
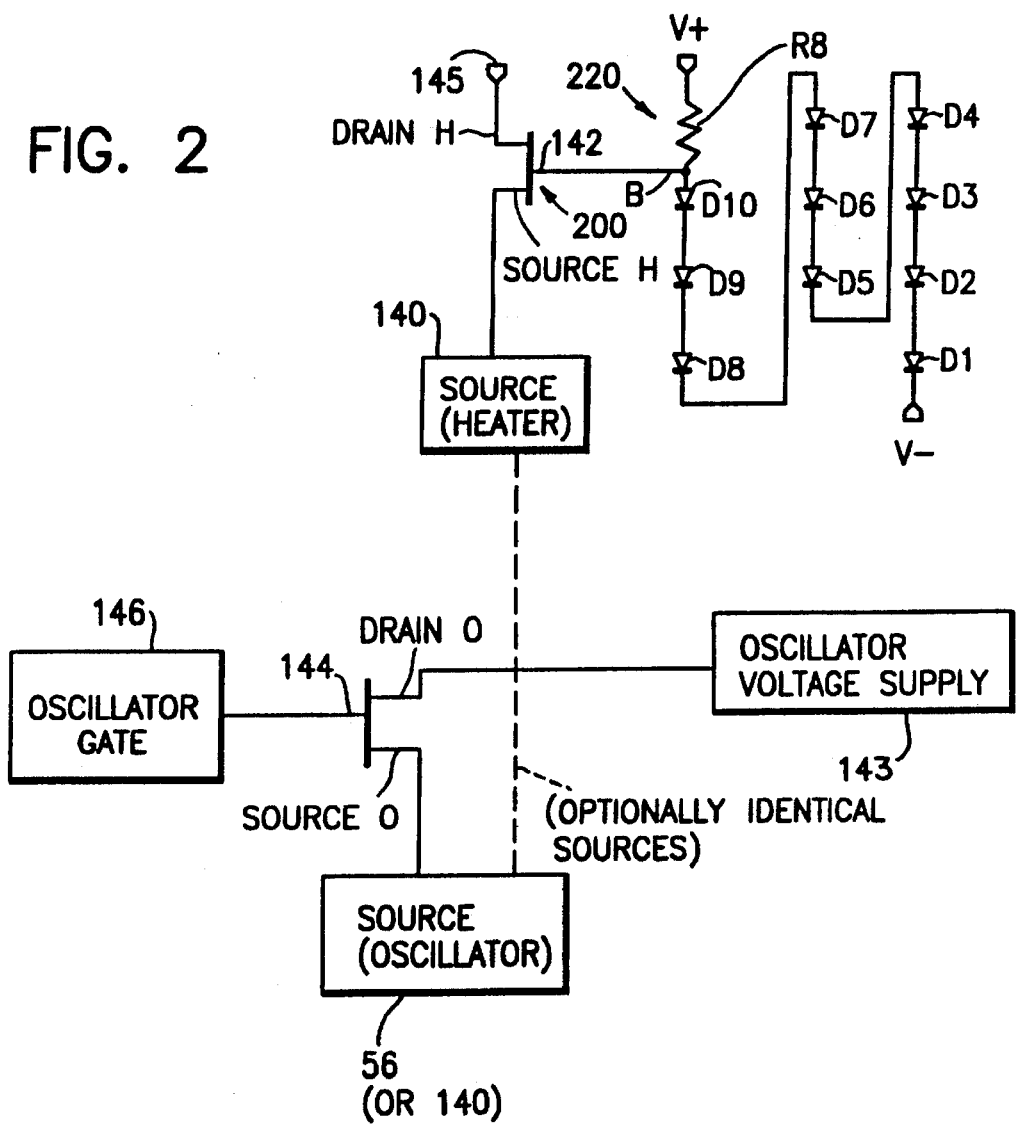
FIG. 2 illustrates a schematic which is common to several embodiments of the present invention.
Figure 3:
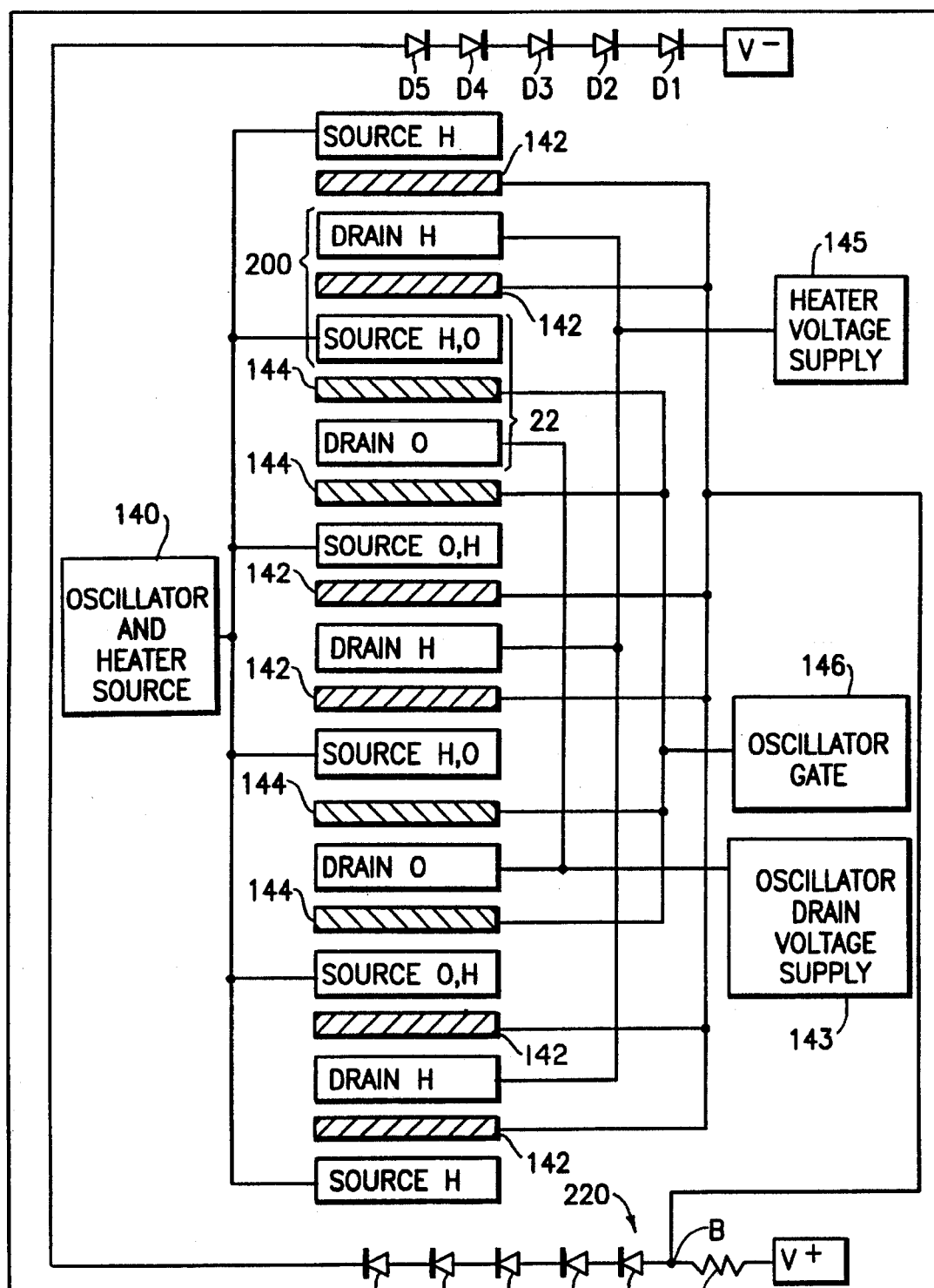
FIG. 3 illustrates one embodiment of a frequency controlled oscillating device of the present invention which is based on the FIG. 2 schematic, in which the diodes D1–D10 and resistor R8, which function as a temperature control portion, are placed in close proximity to the oscillating transistor heating portion.
Figure 7:
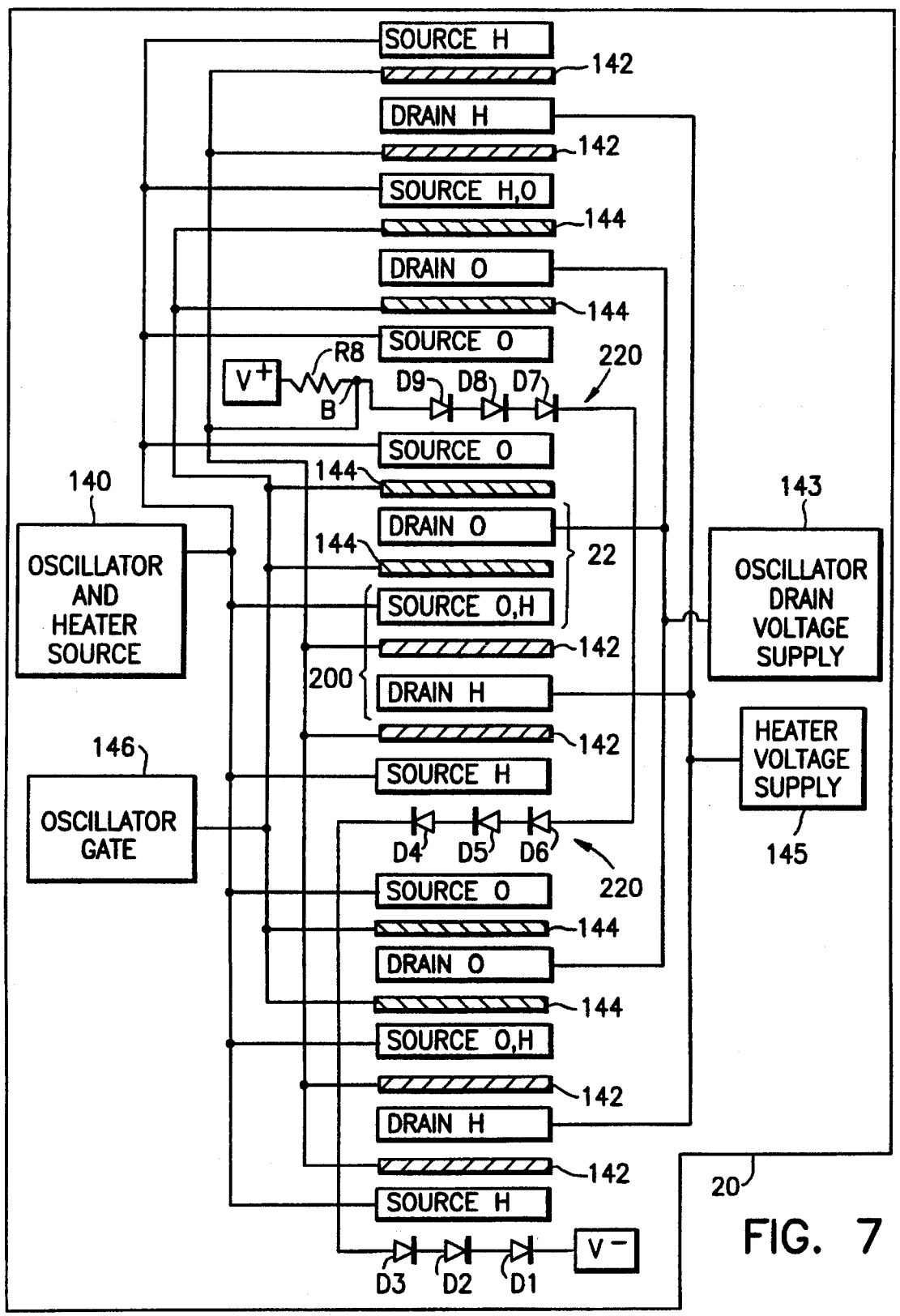
FIG. 7 illustrates another embodiment of a frequency controlled oscillating device of the present invention which is based on the FIG. 2 schematic, in which the diodes D1–D9 associated with temperature sensing are interspersed within the heating - oscillating portion.

Another embodiment of the present invention is illustrated schematically in FIG. 2. Two circuit layouts which are based upon the FIG. 2 embodiment are illustrated in FIGS. 3 and 7, respectively. Each MMIC oscillating transistor 22 in the FIGS. 3 and 7 embodiments is structurally similar to the FIG. 1 embodiment. The primary distinction between the FIGS. 3 and 7 embodiments and the FIG. 1 embodiment is that the heating function in the FIGS. 3 and 7 embodiments is provided by a heating transistor 200. The heating transistor 200, like the oscillating transistor 22, is preferably a FET, but alternately may be any type of suitable transistor.

In FIGS. 3 and 7, the source is shared by both a heating transistor 200 and the MMIC oscillation transistor 22. Each transistor in FIG. 3 is formed by a drain surrounded by a pair of sources, one located above the drain and the other located below the drain.

As a matter of nomenclature in FIGS. 3 and 7, any drain which forms a portion of only the heating transistor is labelled as "Drain H". Any drain which forms a portion of only the MMIC oscillating transistor 22 is labelled as "Drain O". Any source which forms a portion of the MMIC oscillating transistor 22 is labelled "Source O". Any source which is used as a source for the heating transistor 200 is labelled as "Source H". Any source which is utilized both as a source for the MMIC oscillating transistor 22 and as a source for the heating transistor 22 is labelled as either "Source H,O" or "Source O,H", with the first letter defining the transistor being formed with the drain located above that source in the figure, and the second letter defining the type of transistor being formed with the drain located below that source.

In the FIGS. 3 and 7 embodiments, each Source H; each Source O; each Source H,O; and each Source O,H is in electrical communication with an oscillator and heater source 140. If there is some reason to apply different voltages to each Source location, then distinct source voltages may be used. For simplicity, however, it is desirable to use the same voltage source for both the oscillating FET and the heating FET.

Other power sources included in the FIGS. 3 and 7 embodiments include an oscillator drain voltage supply 143, which supplies the voltage to each Drain O. A heater voltage supply 145 applies a voltage to each Drain H. An oscillator gate 146 supplies a voltage for each gate 144 of the oscillating transistors 22.

Each heater gate 142 in FIGS. 3 and 7 is surrounded by both a Source H and a Drain H, which together form the heater transistor 200. Similarly, an oscillator gate 144 is surrounded by both a Source O and a Drain O, which together form the MMIC oscillating transistor 22.

In FIG. 2, the voltage at node B is controlled by a temperature control portion 220 which is applied to the FIGS. 3 and 7 embodiments. The following describes the selection and sizing of the ten diodes D1–D10 of FIG. 3 (or nine diodes D1–D9 of FIG. 7), and resistor R8 of the temperature control portion 220. The number of diodes which may be used is a design choice based upon the specific application and diode characteristics.

When the ambient temperature of the temperature control portion 220 is at the lower end of the range (−50 degrees C., for example), then the voltage at node B will be 0 volts, and the "normally on" heating transistor 200 be actuated causing the largest amount of current to pass from the Drain H to the Source H of the heating transistor 200. This will provide the maximum heat output which the heating transistor is capable of producing. In comparison, when the ambient temperature of the heating portion 220 is at the highest point of its range (+100 degrees C., for example), then the depletion mode heater transistor 200 will be turned off. This will prevent any current from passing between Drain H and the Source H. Therefore, no heat will be produced by the heating transistor 200.

The embodiments illustrated in FIGS. 2, 3, and 7 utilize one or more heating transistors, and represent a fully self contained heater circuit within the MMIC package. It may be difficult to provide a heating transistor 200 which can produce as much heat as the resistive patches R1–R7 of the FIG. 1 embodiment. Therefore, the specific application must be considered carefully before determining whether the FIG. 1 embodiment or the FIG. 2 embodiment is more suitable.

The temperature control portion of the FIG. 3 embodiment is formed from a plurality of forward biased diodes D1–D10, arranged in series and biased with a constant current, and from a resistor R8 which together form a voltage divider. The voltage drop across the forward biased (V$^+$) diodes D1–D10 is a function of the temperature local to the diodes. A set of curves 125a, 125b, 125c of FIG. 4 illustrate the typical current-voltage-temperature relationship of any of the forward biased diodes D1–D10 illustrated in FIGS. 2, 3, 5, and 7. Following the graph, the values of the forward bias voltage (Vf), for a constant current of 0.1 mA, at certain temperatures are illustrated in Table 1.

TABLE 1

| Voltage versus Temperature for a hypothetical diode of constant current (0.1 mA) | |
| --- | --- |
| Temperature (Centigrade) | Vf (Volts) |
| 100 | 0.50 |
| 25 | 0.65 |

TABLE 1-continued

Voltage versus Temperature for a hypothetical diode of constant current (0.1 mA)

| Temperature (Centigrade) | Vf (Volts) |
|---|---|
| −50 | 0.80 |

The voltage change from −50 to 100 degrees Centigrade is thus 0.3 volts and, in this range, demonstrates a nearly linear voltage versus temperature relationship. The total voltage drop in the diode circuit is the sum of the voltage drops across each individual diode. For instance, the total change in the voltage drop across the diodes D1–D8 is 2.4 volts. Voltage drops of this magnitude are sufficient to control the heating element accurately.

Figure 5:
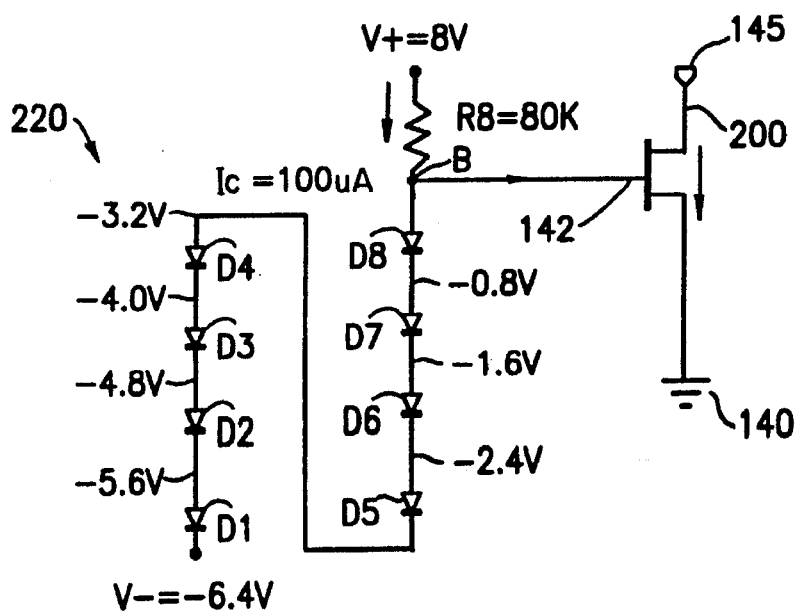
FIG. 5 illustrates a schematic diagram, and associated voltages, of the temperature control portion (220) of FIG. 2.
Figure 6:
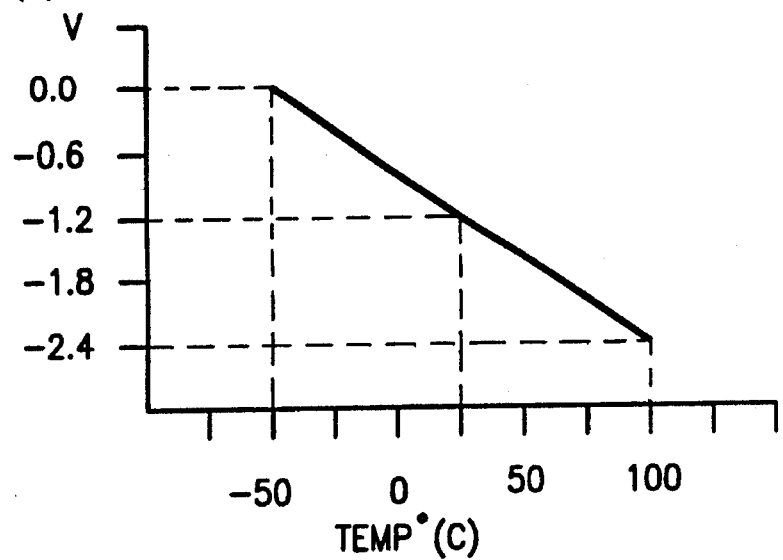
FIG. 6 illustrates a plot of the voltage at node B versus temperature for the temperature control portion of FIG. 5.

The temperature control portion 220 illustrated in FIG. 5 contains eight diodes and an 80 KOhm resistor which are connected across a V+ voltage source and a V− voltage source. At −50 degrees Centigrade, the temperature control portion 220 will exhibit the voltages at each node as illustrated. This circuit will produce the nearly linear voltage versus temperature plot at node B as illustrated in FIG. 6.

In the temperature control portion 220 of FIG. 5, the voltage at node B is applied to the gate of heating transistor 200. If, for example, the ambient temperature of the temperature control portion 220 is −50 degrees Centigrade, then $V_B$ (the voltage at node B) will be 0 as indicated in FIG. 6. This will cause an increased voltage to be applied to gate 142 of the heating transistor 200, thereby increasing the current flow and raising the temperature of the heating transistor 200. Alternatively, when the local ambient temperature of the temperature control portion 30 is 100 degrees, FIG. 6 indicates that $V_B$ is −2.4 Volts. This voltage will be applied to the gate 142, and the current flowing between the source and the drain 142 will be reduced to nearly zero. The temperature of the MMIC oscillating transistor-heating section will therefore remain at approximately 100 degrees Centigrade. When the temperature of the temperature control portion 220 is between the −50 and 100, the above voltage values will be proportionately located between the 0 and −2.4 volt values described above.

In this manner, the temperature of the MMIC oscillating transistor-heater section 120 will be maintained at a constant and desired level which will result in stable MMIC frequency operations. The highest level of the temperature range (100 degrees) is selected to be the highest temperature that the circuit is likely to be attain when operational, since higher temperatures would cause the heater to fall out of regulation.

In order to determine the actual number of required diodes for the FIG. 5 configuration, a computation similar to the following, but modified for the specific application, may be followed:

$$Nd = \text{Number of Diodes} = abs\ (Vp-Vmax)/(Vf[cold] - Vf[hot])$$

Assuming:
Vp= node B (FIG. 5) voltage (hot case)= −2.4 Volts;
Vmax= node B (FIG. 5) voltage (cold case)= 0 Volts;
Vf[cold]= diode forward voltage when cold= 0.8 Volts;
Vf[hot]= diode forward voltage when hot= 0.5 Volts; and
Nd= abs (−2.4−0)/(0.8−0.5)= 2.4/0.3= 8 diodes.

Therefore, based upon the above assumptions, there should be at least eight diodes D1–D8 in FIG. 5 to be able to adequately sense the temperature of the oscillating transistors. The size of these diodes does not effect the operation of the circuit, in that the temperature characteristics are the same for any size diode. However, the diode must be sufficiently large to reliably handle the amount of bias current used in the circuit. This value of current can be made quite small thereby allowing very small diodes to be used.

The size of the resistor R8 in FIG. 5 is chosen to be large enough to provide a nearly constant current to the series connected diodes D1–D8 to ensure that the Vf versus temperature characteristics be maintained. A constant current of 100 uA is a reasonable value. The supply voltage (V+) places an upper limit on the value of the resistor R8:

$$R8 = (V+)/Ic$$

Assume that we chose V+= 8 volts and Ic= 100 uA, then $$R8 = 8/(0.0001) = 80\ KOhms.$$

The interspersed heater transistor 200 and oscillating transistor 22 configuration of FIGS. 3 and 7, have a common Source H,O or Source O,H. In this disclosure, the term "interspersed" is defined as a configuration where at least one oscillating transistor is surrounded by two heating elements of a resistor or transistor configuration. The interspersed configuration provides a more even temperature control across each of the oscillating transistors than in the prior art configurations. In heating element configurations of the present invention it is preferred that an oscillatory transistor is alternated with the heating elements, as illustrated in FIGS. 1, 3 and 7. The operation of the oscillating transistors 22 and the heating transistors 200 are identical between the FIGS. 3 and 7 embodiments. Interspersing heating elements in between the oscillating FETs represents a considerable improvement over the prior art, because the temperature of the oscillating FETs can be controlled much more precisely than the prior art. In the present invention, interspersing of the oscillating FETs with the heating elements permits reducing the size of each oscillating FET to a size that is desired, while maintaining the power of the combined oscillating FETs on a single chip to some desired level. If more overall power is required to be provided from all of the oscillating FETs on a single chip, then a larger number of oscillating FETs can be arranged in parallel. Each oscillating FET can be maintained more accurately at a desired operating temperature. The smaller the oscillating FET, generally the less the variation of the temperature across the FET will be. This configuration provides a technique by which a desired electrical output can be attained, while the temperature of the oscillating FETs can be precisely maintained such that the operating characteristics are predictable.

The temperature control portions 220 differ between the FIGS. 3 and 7 embodiments. In the former embodiment, the diodes D1–D10 are positioned in close proximity to (but not interspersed with) the heating transistors 200 and the oscillating transistors 22. In the latter embodiment, by comparison, the diodes D1–D9 are interspersed among the heating transistor 200 and the oscillating transistors 22. This later embodiment requires that space be provided between some of the transistors to locate the diodes. The benefits of the former configuration is a higher transistor packing density, while the advantage of the latter configuration is a more uniform local heating and heat sensing of the oscillating transistors. Which configuration is more suited to a specific application depends upon the specifics and is a design choice. Other improvements obtained with interspersing a heating element with an oscillating FET are that the power requirements of the heating element are reduced and the heating response times of the oscillating FET are reduced.

The dimensions of the heating FETs and oscillating FETs, vary considerably depending upon the designer, the technology used, and the design rules. In typical designs, however, the maximum center-to-center spacing of the source and drains of the oscillating FETs (measured in the vertical direction in FIGS. 1, 3 and 7) is typically 10 microns.

Even though oscillating FETs and heating FETs are described in the above embodiments, it is within the scope of the present invention to use any suitable transistor or device in either of these applications. The above describes one embodiment of the present invention. It is within the scope of the present invention to modify the scope of the invention upon consideration of the claim limitations.

We claim:

1. A frequency stable oscillating device formed on a substrate and comprising:

at least one oscillating transistor having a source electrode and disposed on said substrate;

at least one heating FET transistor having source and drain electrodes disposed on said substrate proximate to said at least one oscillating transistor wherein said source of said at least one heating FET transistor and said source of said at least one oscillating transistor are directly electrically connected;

a temperature sensor means for sensing a temperature of said at least one oscillating transistor and providing a signal representative of said sensed temperature; and temperature control means, connected to and responsive to said signal from said temperature sensor, for supplying a variable signal to said at least one heating element which is dependent upon a local temperature of said at least one oscillating transistor.

2. The frequency stable oscillating device as described in claim 1, wherein said temperature sensor comprises a voltage divider.

3. The frequency stable oscillating device as described in claim 2, wherein said voltage divider comprises at least one diode.

4. The frequency stable oscillating device as described in claim 2, wherein said voltage divider comprises a plurality of diodes arranged in series.

5. The frequency stable oscillating device as described in claim 2, wherein said voltage divider comprises a resistor.

6. The frequency stable oscillating device as described in claim 1, wherein the oscillating device utilizes MMIC technology.

7. The frequency stable oscillating device as described in claim 1 wherein said oscillating transistor is constructed using IC technology.

8. The frequency stable oscillating device as described in claim 1, wherein said substrate is formed from silicon.

9. The frequency stable oscillating device as described in claim 1, wherein said substrate is formed from GaAs.

10. The frequency stable oscillating device as described in claim 1, wherein a plurality of said heating elements disposed on said substrate are interspersed with a plurality of said oscillating transistors disposed on said substrate.

11. The frequency stable oscillating device as described in claim 1, wherein said heating element is formed within close proximity to said oscillating transistor.

12. A frequency stable oscillating device formed on a substrate and comprising:

at least one oscillating transistor disposed on said substrate;

at least one heating transistor disposed on said substrate in close proximity and thermally coupled to said at least one oscillating transistor;

a temperature sensor capable of sensing a temperature of said at least one oscillating transistor and providing a signal representative of said sensed temperature; and temperature control means connected to said temperature sensor and, whose operation is regulated by said signal from temperature sensor, for supplying a variable signal to said heating transistor which is dependent upon a local temperature of said at least one oscillating transistor, wherein said at least one heating transistor and said at least one oscillating transistor share a common source.

\* \* \* \* \*